United States Patent
Pan et al.

(10) Patent No.: US 11,693,326 B1
(45) Date of Patent: Jul. 4, 2023

(54) SYSTEM AND METHOD FOR DYNAMICALLY CONTROLLING TEMPERATURE OF THERMOSTATIC RETICLES

(71) Applicant: Taiwan Semiconductor Manufacturing Company, Hsinchu (TW)

(72) Inventors: Tzu-Jung Pan, New Taipei (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/692,356

(22) Filed: Mar. 11, 2022

(51) Int. Cl.
*G03F 7/20* (2006.01)
*G03F 7/00* (2006.01)

(52) U.S. Cl.
CPC ......... *G03F 7/70875* (2013.01); *G03F 7/705* (2013.01); *G03F 7/70525* (2013.01); *G03F 7/70891* (2013.01)

(58) Field of Classification Search
CPC ............ G03F 7/70891; G03F 7/70283; G03F 7/70308; G03F 7/70591; G03F 7/70716; G03F 7/70725; G03F 7/707; G03F 7/70733; G03F 7/70741; G03F 7/708; G03F 7/70808; G03F 7/70841; G03F 7/7085; G03F 7/70858–70891; G03F 7/70908; G03F 7/70941; G03F 7/70783; G03F 7/707975; G03F 7/70983; G03F 7/70991; G03F 7/70483–70541; G03F 1/22; G03F 1/68; G03F 1/82; G03F 1/84
USPC .................................. 355/30, 52–55, 67–77
See application file for complete search history.

(56) References Cited

U.S. PATENT DOCUMENTS

| | | | |
|---|---|---|---|
| 6,342,941 B1 * | 1/2002 | Nei ..................... | G03F 7/70691 355/53 |
| 2011/0029685 A1 * | 2/2011 | Itai ..................... | G03F 7/70525 709/233 |
| 2012/0141928 A1 * | 6/2012 | Ishii .................... | G03F 7/70875 430/5 |

(Continued)

FOREIGN PATENT DOCUMENTS

DE 102011086513 A1 * 5/2013 ......... G03F 7/70783

OTHER PUBLICATIONS

English translation of DE102011086513, published May 16, 2013. (Year: 2013).*

*Primary Examiner* — Christina A Riddle
(74) *Attorney, Agent, or Firm* — Lippes Mathias LLP

(57) ABSTRACT

A system and method for dynamically controlling a temperature of a thermostatic reticle. A thermostatic reticle assembly that includes a reticle, temperature sensors located in proximity to the reticle, and one or more heating elements. A thermostat component that is in communication with the temperature sensors and the heating element monitors the current temperature of the reticle relative to a steady-state temperature. In response to the current temperature of the reticle being lower than the steady-state temperature, the heating elements are activated to preheat the reticle to the steady-state temperature.

20 Claims, 11 Drawing Sheets

(56) References Cited

U.S. PATENT DOCUMENTS

| | | | |
|---|---|---|---|
| 2015/0192856 A1* | 7/2015 | Onvlee | G03F 7/70875 355/30 |
| 2018/0275525 A1* | 9/2018 | Bow | G03F 7/70875 |
| 2021/0033987 A1* | 2/2021 | Yang | G03F 7/705 |
| 2022/0057723 A1* | 2/2022 | Monkman | G03F 7/70875 |

* cited by examiner

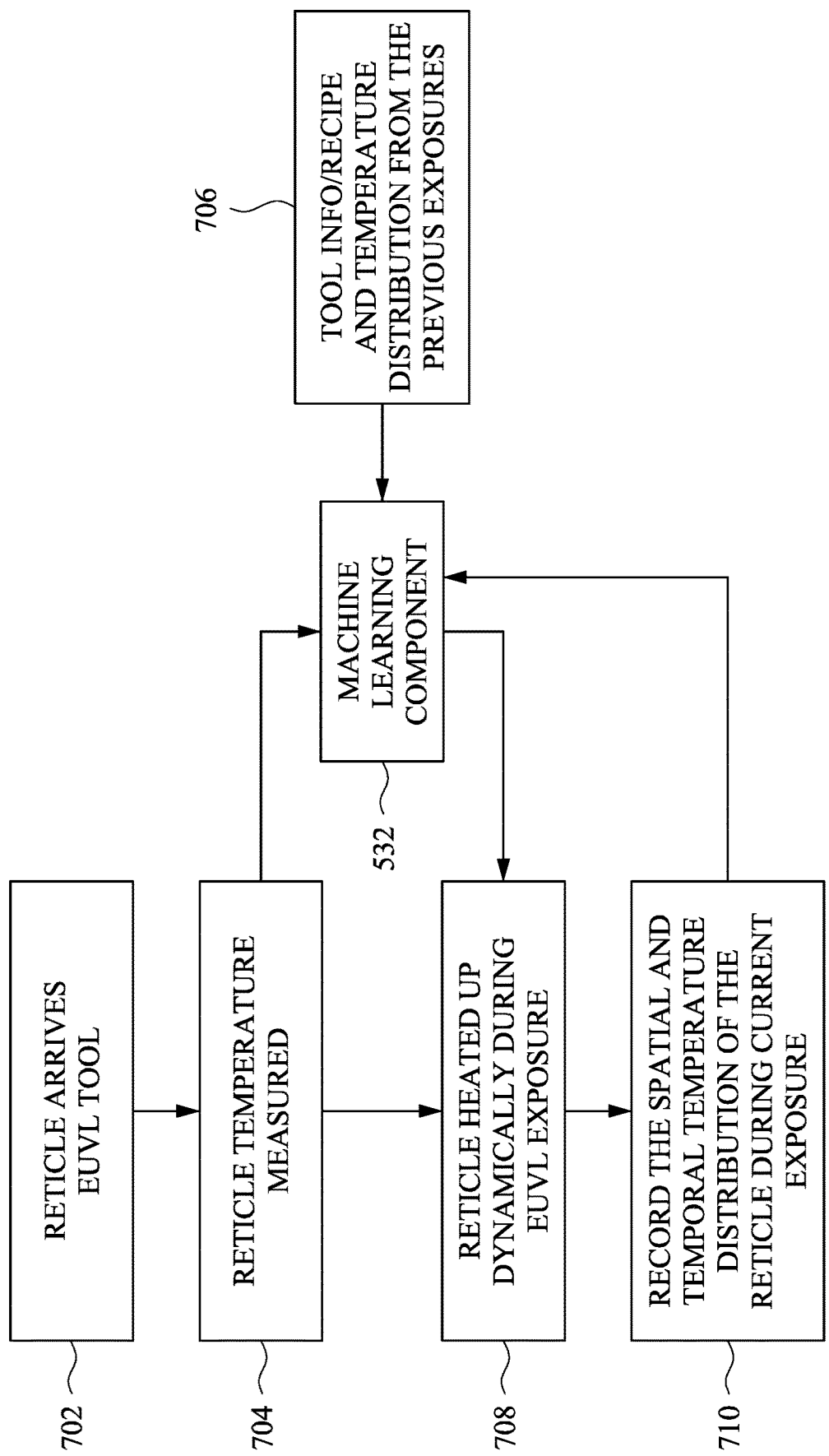

US 11,693,326 B1

SYSTEM AND METHOD FOR DYNAMICALLY CONTROLLING TEMPERATURE OF THERMOSTATIC RETICLES

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. Each exposure of the reticle during EUV operations causes fluctuations in reticle temperature, which can cause defects in the transferred pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a functional diagram depicting training and interactions of the machine learning component in accordance with some embodiments.

DETAILED DESCRIPTION

Figure 1:
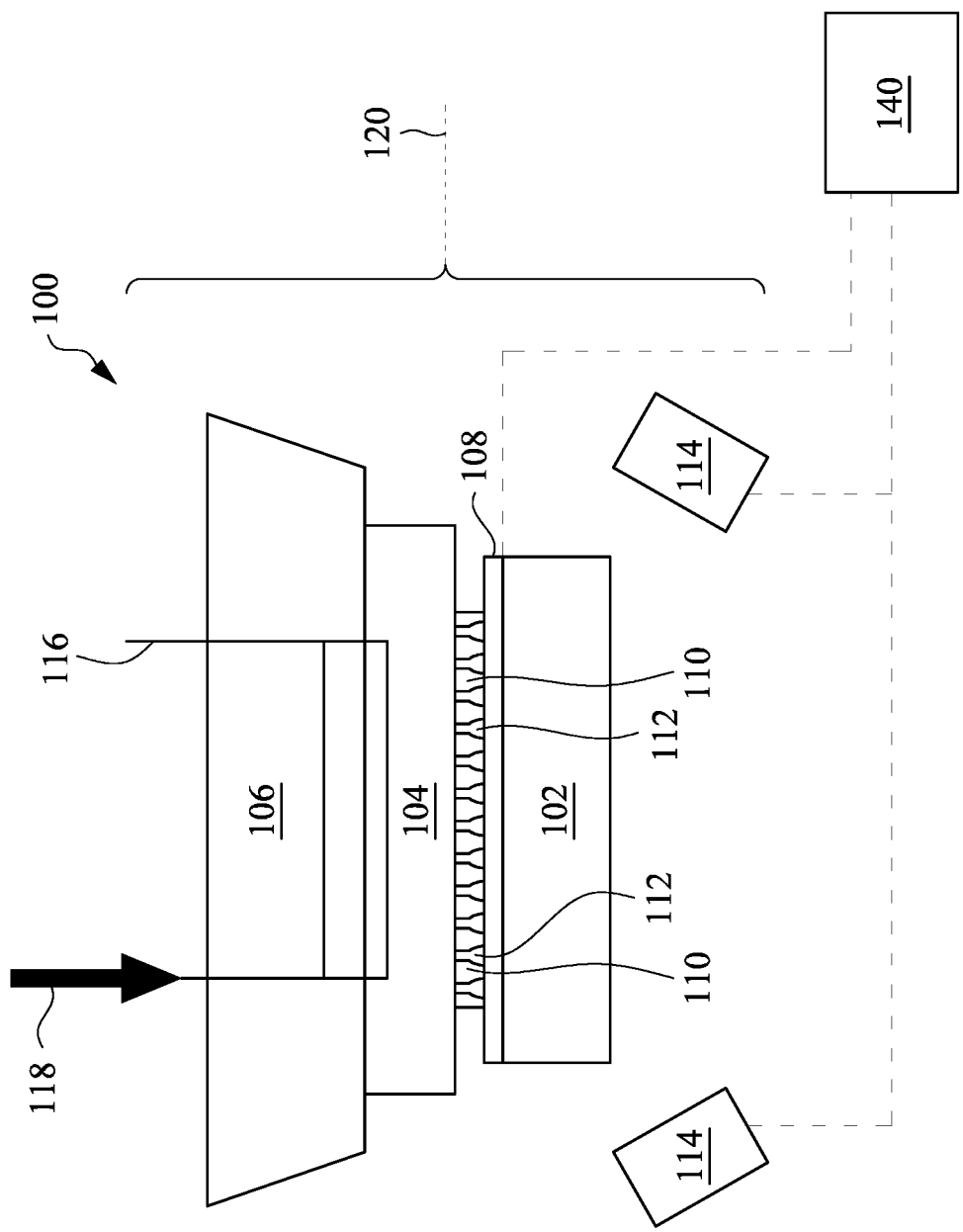
FIG. 1 is a side cross-sectional view of a heated thermostatic EUV reticle assembly in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure may refer to temperatures for certain method steps. It is noted that these references are to the temperature at which the heat source is set, and do not specifically refer to the temperature which must be attained by a particular material being exposed to the heat.

In the present disclosure, the terms "photolithographic mask", "mask", "photomask", and "reticle" are used interchangeably.

In the present disclosure, the terms "particulate", "residual particles", and "residual debris" are used interchangeably.

The term "optic" is used herein to refer broadly to components which reflect and/or transmit and/or operate on incident light, such as mirrors, lenses, windows, filters, or reflectors. Such components can operate at different wavelengths from each other.

The term "turbulence" or "turbulent" is used herein to refer to unsteady or chaotic particle motion, in contrast to laminar flow or Brownian motion.

The present disclosure is generally related to extreme ultraviolet (EUV) lithography systems and methods. The EUV lithography process employs light in the extreme ultraviolet (EUV) region, having a wavelength of about 1 nm to about 100 nm. One type of EUV light source is laser-produced plasma (LPP). LPP technology produces EUV light by focusing a high-power laser beam onto small target droplets to form highly ionized plasma that emits EUV radiation with a peak maximum emission at about 13.5 nm. The EUV light is then collected by a collector mirror and reflected by optics towards a photolithographic mask, i.e., a reticle, and then towards a lithography target, e.g., a wafer. The reticle during the initial operation of the EUV process is typically at a lower temperature, which increases during each subsequent wafer processing operation. This temperature variation causes changes in the overlay performance, sometimes as a result of the thermal expansion of the reticle via the EUV light. Some EUV systems utilizing a cooling system to reduce and/or maintain the temperature of the reticle and minimize the thermal expansion during wafer processing.

More particularly, the present disclosure is related to systems and methods for improving overlay performance among wafers by controlling the temperature of reticles (i.e., photomasks) to avoid thermal expansion of the reticle. EUV operations result in a substantial number of fluctuations in temperature. The present disclosure provides real-time/fast calculations and rapid response times to UV energy, thereby compensating for temperature variations by preheating a reticle to a steady-state temperature. The heating mechanism may also be utilizing during subsequent EUV operations to maintain the aforementioned steady-state temperature of the reticle. That is, the systems and methods set forth herein provide dynamic control of the temperature of the reticle to control the reticle temperature to a constant value. As a result of such temperature control, high volume manufacturing is improved, as the reticle remains at a constant temperature at each round of exposure.

Figure 4:
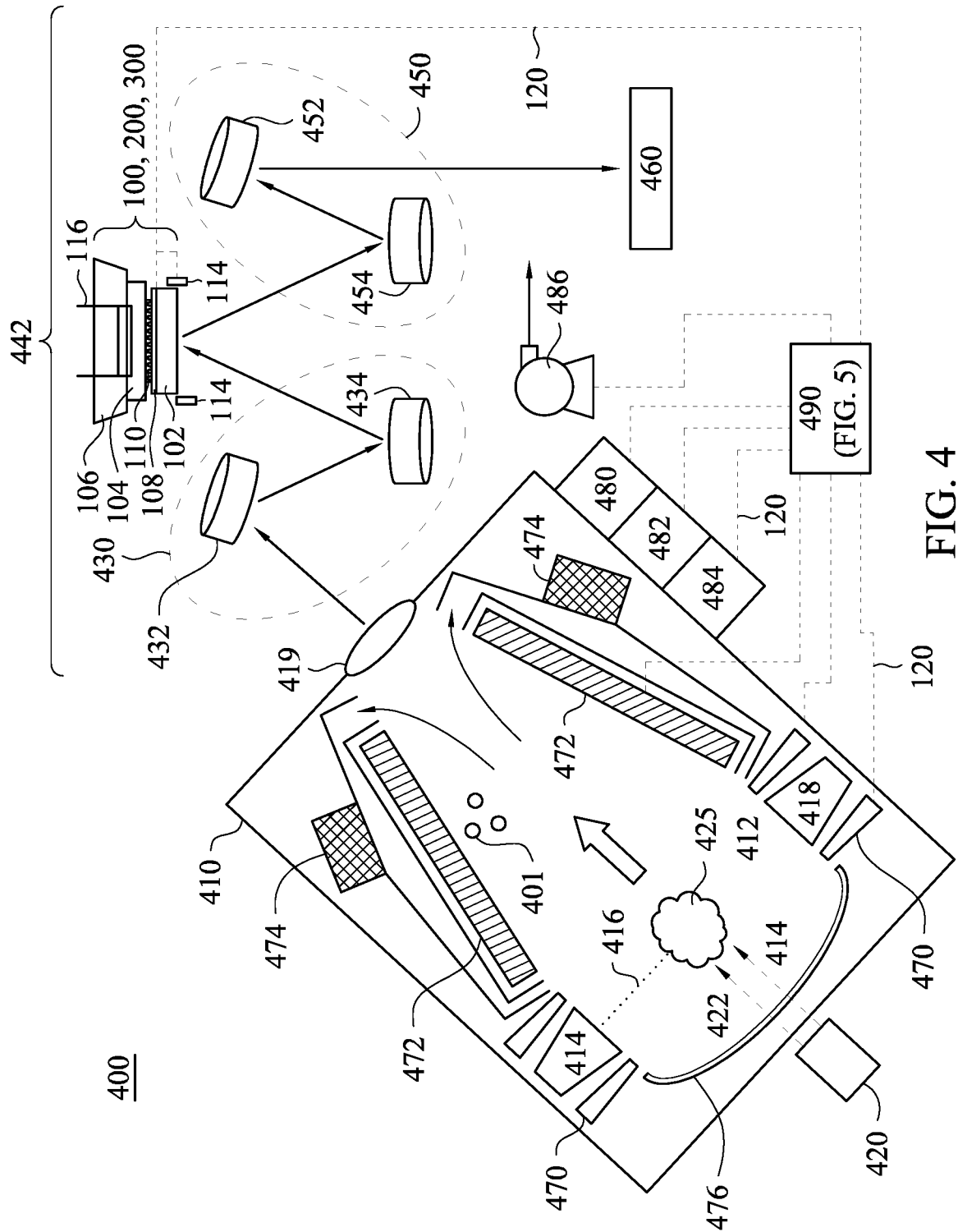
FIG. 4 is a schematic view of a lithography system in accordance with some embodiments.

Turning now to FIG. 1, there is shown a heated thermostatic EUV reticle assembly 100 in accordance with a first embodiment of the subject application. As shown in FIG. 1, the heated thermostatic EUV reticle assembly 100 includes a reticle 102 removably coupled to a clamp 104 of a chuck 106 associated with an EUV system 400 (as illustrated in FIG. 4, below), and a heating element 108 in contact with the reticle 102. As depicted in FIG. 1, one or more burls 110 are disposed between the clamp 104 and reticle 102, the burls 110 protrude from the clamp 104 to support the reticle 102. In some embodiments, each burl 110 corresponds to a column extending from the clamp 104 to directly contact the reticle 102. Each burl 110 is preferably separated by a gap 112 from the next succeeding burl 110 so as to support the reticle 102 at discrete locations thereon.

The skilled artisan will appreciate that the distance between the center of a first burl 110 supporting the reticle 102 and the center of a second burl 110 supporting the reticle 102 is referred to herein as pitch. The pitch can be substantially the same over the clamp 104; substantially the same over a portion, but less than the entire clamp 104; or variable. For example, the pitch can be five millimeters (5 mm) or less. Some embodiments of the pitch can be three millimeters (3 mm) or less. Some embodiments of the pitch can be two millimeters (2 mm) or less. The illustrated values of pitch offer different degrees of support to the underside of the reticle 102.

The burls 110 illustrated in FIG. 1 are in substantially-planar alignment. As used herein, "substantially-planar alignment" includes planar alignment of the surfaces of the burls 110 within a region of the clamp 104 supporting the reticle 102. However, according to some embodiments, substantially-planar alignment is not necessarily absolutely planar, but includes differences in the height of the surfaces of the burls 110 that are within .+−.10%, .+−.5%, .+−.2%, or .+−.1%. The substantially-planar alignment of the burls 110 provides sufficient support of the reticle 102 during EUV lithography operations.

The assembly 100 further includes a heating element 108 in contact with the reticle 102 configured to provide heat to the reticle 102. In some embodiments, the heating element 108 is configured to preheat the reticle 102 to its corresponding steady-state operating temperature (e.g., approximately 50 degrees Celsius) from the ambient temperature (e.g., approximately 20 degrees Celsius). It will be appreciated that the steady-state operating temperature of the reticle 102 may vary depending upon its construction, thickness, materials, and the like. In other embodiments, the heating element 108 may be configured to maintain a constant or steady-state temperature of the reticle 102 during EUV lithography operations, e.g., in between wafer processing. According to one embodiment, the heating element 108 may be implemented as an inductive heating element controlled via a controller 490 (as discussed in greater detail below with respect to FIGS. 4-5). Such an inductive heating element may be constructed of copper (or other conductive material) suitable for generating an eddy current from a rapidly alternating magnetic field. In other embodiments, a resistive heating element or other direct-contacting heating method may be herein. In some embodiments, the heating element 108 is affixed to the top of the reticle 102 (i.e., the portion of the reticle 102 in contact with the burls 110 of the clamp 104) so as to be independent of diffraction (i.e., not affect lithography operations of the EUV system 400).

The assembly 100 further includes one or more temperature sensors 114 located in relative proximity to the reticle 102 and in communication with the controller 490 of FIG. 4. In some embodiments, the one or more temperature sensors 114 are communicatively coupled to a thermostat component 140, programmably configured to receive output from the sensors 114 and control operation of the heating element 108. According to one embodiment, the thermostat component 140 may be configured to measure and control the temperature of the reticle 102 (via activation of the heating element 108) with spatial and temporal accuracy. That is, the thermostat component 140 may be configured to monitor a temperature at a particular location on the reticle 102 and at a particular time associated therewith to accurately adapt/control the temperature of the reticle 102 in accordance with EUV operations. For example, the thermostat component 140 may be configured to check and correct the temperature of the reticle 102 every 2 to 15 seconds, and in some instances conduct measurements every 5 to 10 seconds. Further, the thermostat component 140 may be configured to control the heating element 108 to heat within a range of 20 to 80 degrees Celsius so as to raise the temperature of the reticle 102 to a predetermined steady-state temperature, as discussed in greater detail below.

As illustrated in FIG. 1, the assembly 100 includes an optional chiller component 116 in accordance with one embodiment. The optional chiller component 116 may be controlled via the thermostat component 140 or other control component, as set forth in FIG. 5. When so equipped, the chiller component 116 may be configured to allow a coolant 118 to pass through the chuck 106 and clamp 104, thereby reducing the temperature of the reticle 102 during EUV operations. It will be appreciated that each EUV operation affects the temperature of the reticle 102, and a reticle having too high a temperature (or too low a temperature) may negatively impact wafer throughput. Accordingly, while the heating element 108 may be used to preheat the reticle 102 to a predetermined steady-state temperature, the thermostat component 140 may also utilize the chiller component 116 to reduce the reticle 102 to the aforementioned steady-state temperature. Additional features and operations of the assembly 100 are described in greater detail below.

Figure 2:
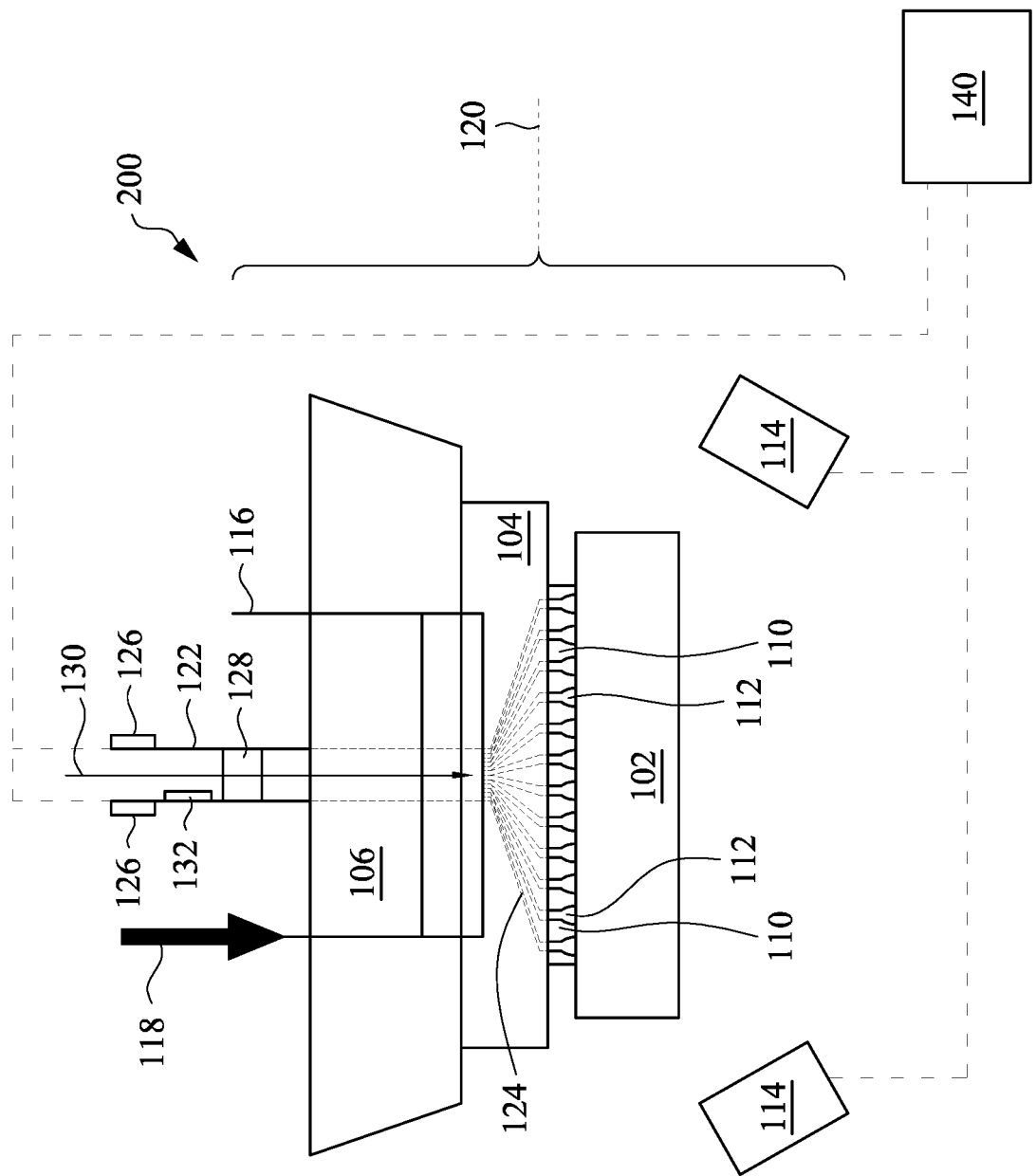
FIG. 2 is a side cross-sectional view of a heated thermostatic EUV reticle assembly in accordance with some embodiments.

Referring now to FIG. 2, there is shown a heated thermostatic EUV reticle assembly 200 in accordance with a second embodiment of the subject application. As was previously discussed above with respect to FIG. 1, the heated thermostatic EUV reticle assembly 200 of FIG. 2 includes a reticle 102 removably coupled to a clamp 104 of a chuck 106 associated with an EUV system 400 (as illustrated in FIG. 4, below). As depicted in FIG. 2, the assembly 200 includes one or more burls 110 are disposed between the clamp 104 and reticle 102, the burls 110 protrude from the clamp 104 to support the reticle 102. In some embodiments, each burl 110 corresponds to a column extending from the clamp 104 to directly contact the reticle 102. Each burl 110 is preferably separated by a gap 112 from the next succeeding burl 110 so as to support the reticle 102 at discrete locations thereon. The gaps 112 illustrated in FIG. 2 are each coupled to a passageway or channel 124 fluidically coupled to a gas inlet 122 supplying a gas 130 to effectuate heating of the reticle 102 in accordance with one embodiment.

It will be appreciated that the spacing, e.g., pitch, referenced above with respect to FIG. 1 is also applicable to the embodiment set forth in FIG. 2. Further, the skilled artisan will appreciate that the pitch may be modified to enable greater flow of the aforementioned gas 130 to the reticle 102. Additionally, although illustrated in FIG. 2 as having an equal number of passageways 124 to gaps 112, any suitable ratio of passageways 124 to gaps 112 may be used in accordance with varying embodiments contemplated herein. For example, there may be one passageway 124 for every two gaps 112, or one or more passageways 124 feeding one or more gaps 112. Accordingly, the illustrated passageways 124 are intended solely to illustrate the indirect heating using the gas 130 according to the embodiment of FIG. 2.

The assembly 100 further includes one or more heating elements 126 in contact with the gas inlet supply 122 configured to heat the gas 130 prior to transit into the passageways 124. In some embodiments, the gas 130 may be hydrogen or another suitable gas that will not negatively impact EUV operations, as will understood by those skilled in the art. It will be understood that positioning of the heating elements 126 in FIG. 2 is intended solely to illustrate one mechanism for heating the gas 130, and the elements 126 may be located further away from the chuck 106. Further, the heating elements 126 may be positioned outside the EUV system 400 along the gas inlet supply 122. In some embodiments, the heating elements 126 are configured to heat the gas 130 flowing into the reticle 102 so as to preheat the reticle 102 to its corresponding steady-state operating temperature (e.g., approximately 50 degrees Celsius) from the ambient temperature (e.g., approximately 20 degrees Celsius). Variations in this steady-state operating temperature are contemplated in the embodiments set forth herein. According to one embodiment, the heating elements 126 may be implemented as an inductive heating element controlled via a thermostat component 140 or controller 490 (as discussed in greater detail below with respect to FIGS. 4-5). Such an inductive heating element may be constructed of copper (or other conductive material) suitable for generating an eddy current from a rapidly alternating magnetic field. In other embodiments, a resistive heating element or other direct-contacting heating method may be herein.

The assembly 200 further includes one or more temperature sensors 114 located in relative proximity to the reticle 102 and in communication with the thermostat component 140 and/or controller 490 of FIG. 4. In some embodiments, the one or more temperature sensors 114 are communicatively coupled to a thermostat component 140, programmably configured to receive output from the sensors 114 and control operations of the heating elements 126. According to one embodiment, the thermostat component 140 may be configured to measure and control the temperature of the reticle 102 (via activation of the heating elements 108 and/or a gas flow valve 128 positioned inline of the gas supply inlet 122) with spatial and temporal accuracy. That is, the thermostat component 140 may be configured to monitor a temperature at a particular location on the reticle 102 and at a particular time associated therewith to accurately adapt/control the temperature of the reticle 102 in accordance with EUV operations. As discussed above, the thermostat component 140 may be configured to check and correct the temperature of the reticle 102 every 2 to 15 seconds, and in some instances conduct measurements every 5 to 10 seconds. Further, the thermostat component 140 may be configured to control the heating elements 126 to heat the gas 130 within a range of 20 to 80 degrees Celsius so as to raise the temperature of the reticle 102 to a predetermined steady-state temperature, as discussed in greater detail below.

As illustrated in FIG. 2, the assembly 200 includes an optional chiller component 116 in accordance with one embodiment. The optional chiller component 116 may be controlled via the thermostat component 140 or other control component, as set forth in FIG. 5. When so equipped, the chiller component 116 may be configured to allow a coolant 118 to pass through the chuck 106 and clamp 104, thereby reducing the temperature of the reticle 102 during EUV operations. Operations of the chiller component 116 in FIG. 2 may similarly be performed as set forth above with respect to FIG. 1.

Figure 3:
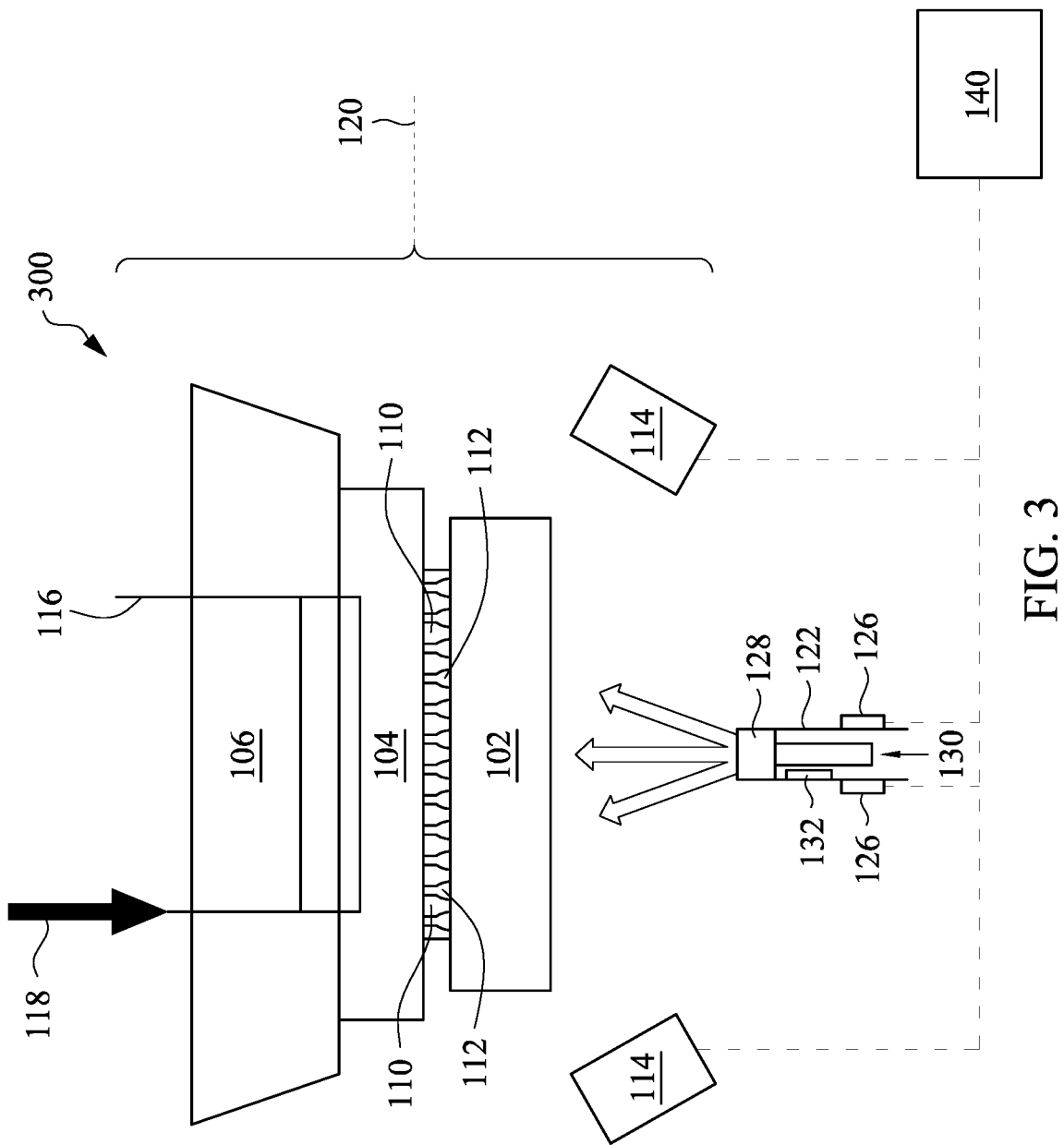
FIG. 3 is a side cross-sectional view of a heated thermostatic EUV reticle assembly in accordance with some embodiments.

FIG. 3 illustrates a heated thermostatic EUV reticle assembly 300 in accordance with a third embodiment of the subject application. It will be appreciated that the embodiment illustrated in FIG. 3 is suitably adapted for use when a pellicle is not present, thereby allowing for the direct heating (without gas flowing directly onto the pellicle, potentially damaging the pellicle). The structure of the assembly 300 is similar to that of FIGS. 1 and 2 in that it includes the aforementioned reticle 102, clamp 104, chuck 106, burls 110 and gaps 112. However, as shown in FIG. 3, the indirect heating of the reticle 102 is accomplished via a gas 130 supplied to flow directly onto the reticle 102. That is, the gas inlet line 122 is positioned below the reticle 102, e.g., entering from a wall (not shown) and directed up to the reticle 102. Operations of the assembly 300 of FIG. 3 function similar to those of FIG. 2 in that the heated gas 130 is used to preheat the reticle to the needed steady-state temperature. Flow the gas 130, via valve 128 and heating of the gas 130 via heating elements 126 are similarly conducted as set forth above.

Turning now to FIG. 4, there is shown an EUV system 400 capable of employing the thermostatic EUV reticle assembly 100, 200, or 300 of FIGS. 1-3, respectively, in accordance with one embodiment of the subject application. That is, FIG. 4 provides a schematic diagram, not drawn to scale, illustrating the various components of an EUV lithography system 400. Generally, the EUV lithography system 400 includes an EUV light source 410 that generates EUV light and a laser source 420. Downstream of the EUV light source 410 is an illumination stage 430, which collects and focuses the EUV light on the reticle 102. Downstream of the reticle 102 is the projection optics module 450, which is configured for imaging the pattern of the reticle 102 (i.e., photomask) onto a substrate 460, such as a semiconductor wafer. The lithography system 400 may include other modules or be integrated with or coupled to other modules. Operations of the EUV lithography system 400 may be controlled by a controller 490 communicatively coupled to the various components and modules described herein. The controller 490 is described in greater detail below with respect to FIG. 5.

The EUV light source 410 itself includes a radiation source chamber 412 which encloses the plasma reaction that creates EUV light. The radiation source chamber 412 includes a target droplet generator 414. The target droplet generator 414 deposits a plurality of target droplets 416 into the radiation source chamber 412. In some embodiments, the target droplets 416 are tin (Sn) droplets. In some embodiments, the target droplets 416 are made of tin (Sn). In other embodiments, the target droplets 416 may include alternative types of material, for example, a tin-containing liquid material such as eutectic alloy containing tin or lithium (Li). The tin droplets 416 may be deposited at a rate, for example of about 50 thousand droplets per second.

A laser source 420 is also present, which emits one or more laser beams into the radiation source chamber 412 that contact the target droplets 416 to produce EUV light. In some embodiments, the laser source 420 may be a carbon dioxide (CO2) or a neodymium-doped yttrium aluminum garnet (Nd:YAG) laser source. The laser source 420 may be a multi-stage laser having a plurality of stages configured to amplify laser light produced by a prior stage. In some embodiments, the laser source 420 may produce multiple beams. For example, as illustrated in FIG. 4, a pre-heat laser pulse 422 can be used to create a low-density target plume, which is subsequently heated (or reheated) by a main laser pulse 424 that generates EUV light. The laser source 420 generally also includes optics and other focal components for directing the laser beams in a desired direction.

The radiation source chamber 412 includes windows or lenses, which are substantially transparent to the laser wavelength. The generation of the laser beams is synchronized with the target droplets 416. The pre-heat laser pulse 422 heats the target droplets and expands them into lower-density target plumes. A delay between the pre-pulse 422 and the main pulse 424 is controlled to allow the target plume to form and to expand to an optimal size and geometry. When the main pulse 424 heats the target plume, a high-temperature plasma field 425 is generated. The plasma 425 emits EUV radiation in all directions. The EUV light travelling in the wrong direction (i.e. away from the output port) is collected by a collector mirror 476.

The collector mirror 476 has a reflective surface that reflects and focuses EUV light. In some embodiments, the collector mirror 476 has an ellipsoidal shape. The collector mirror 476 may be coated with materials similar to that of the reticle 102 for reflecting EUV light. EUV light is then directed towards an output port 419, through which the EUV light exits the EUV light source 410 to enter the rest of the lithography system 400. A droplet catcher 418 may be installed opposite the target droplet generator 414. The droplet catcher 418 is used to catch excess target droplets 416.

In the EUV light source 410, the plasma 425 caused by the laser application creates EUV light and also creates physical debris, such as ions, gases and atoms of the droplet 416. To prevent the accumulation of particulate and debris on the collector mirror 476, a buffer gas can be injected along the surface of the collector mirror via gas ports 470. The buffer gas can be $H_2$, He, Ar, $N_2$, or some other inert gas, but is usually either hydrogen. Hydrogen gas has a low EUV absorption profile. Hydrogen will react with metals to form a metal hydride. In particular, hydrogen will react with tin to form $SnH_4$ as a gaseous product at the temperatures of the EUV generation process, which can be captured and pumped out. The gaseous $SnH_4$ is then pumped out of the radiation source chamber 412.

Other debris collection mechanisms may also be present. For example, to further trap residual tin particles and other debris, the interior of the radiation source chamber 412 may include a plurality of vanes 472 disposed around a frusto-conical support frame which narrows in diameter from the plasma field to the output port 419. The vanes 472 extend generally radially inwards from the support frame. The vanes 472 may be made, for example, from molybdenum or stainless steel. The temperature of the vanes 472 may be controlled to keep tin in a liquid state but not a gaseous state, or in other words above about 231° C. but below about 1,100° C. (at the operating pressure of the EUV light source). For example, the vanes 472 may include channels through which a liquid or gas can be flowed. The liquid or gas may be heated or cooled, as appropriate, to obtain a desired temperature for the vanes 472. The vanes 472 may also be shaped to direct the liquid tin to an appropriate drain, for example via capillary action and/or wicking action. It will be appreciated that because gas molecules absorb EUV light, the radiation source chamber 412 is typically maintained at vacuum or a low-pressure environment to avoid EUV intensity loss. Accordingly, the EUV lithography system 400 includes one or more vacuum pumps 486 fluidically coupled to the radiation source chamber 412 and operable in conjunction with the controller 490, as illustrated in FIG. 4.

In some embodiments, the radiation source chamber 412 may be equipped with one or more sensors 480, 482, 484 in communication with the controller 490, as illustrated in FIG. 4. In such embodiments, the one or more sensors 480, 482, and 484 may respectively correspond to temperature sensors (thermometer), pressure gauges, and/or flow meters. Operations of the radiation source chamber 412 may be controlled by the controller 490 in accordance with output of the one or more sensors 480-484, as will be appreciated by the skilled artisan.

The EUV system 400 depicted in FIG. 4 further includes a process chamber 442 wherein the reticle assembly 100, 200, 300 is positioned for processing of the wafer 460. In the illumination stage 430, the EUV light may be collected and focused as a beam, for example using field facet mirror 432 that splits the beam into a plurality of light channels. These light channels can then directed using one or more relay mirrors 434 onto the plane of the reticle 102. The projection optics module 450 may include refractive optics or reflective optics for carrying the image of the pattern defined by the photomask. Illustrative mirrors 452, 454 are shown. The pattern is then focused onto substrate 460, which may be for example a silicon wafer.

During initial start up of the EUV lithography system 400, the reticle 102 within the process chamber 442 may be at an ambient temperature, e.g., 20 degrees Celsius. During subsequent operations the temperature of the reticle 102 typically increases to a steady-state temperature, e.g., 50 degrees Celsius (dependent upon the type of reticle, material, number of operations performed, cycle time, scan speed, etc., of the system 400). Accordingly, to improve the output of the lithography system 400 and ensure uniformity of the overlay performance, the reticle 102 may be preheated to the predetermined steady-state temperature via operations of the heating element 108 or gas 130, as discussed above with respect to FIGS. 1-3.

Figure 6A:
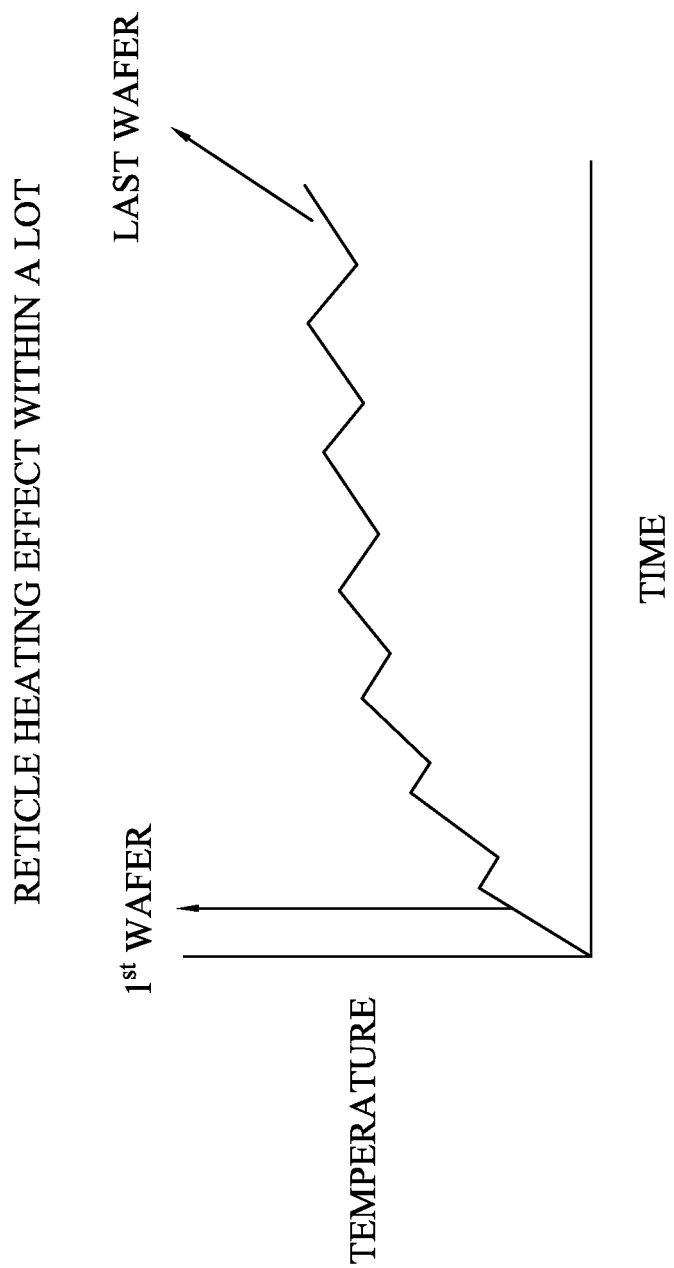
FIG. 6A is a graph of the reticle heating effect within a lot of wafers from the first wafer to the last wafer over time without preheating in accordance with some embodiments.
Figure 6B:
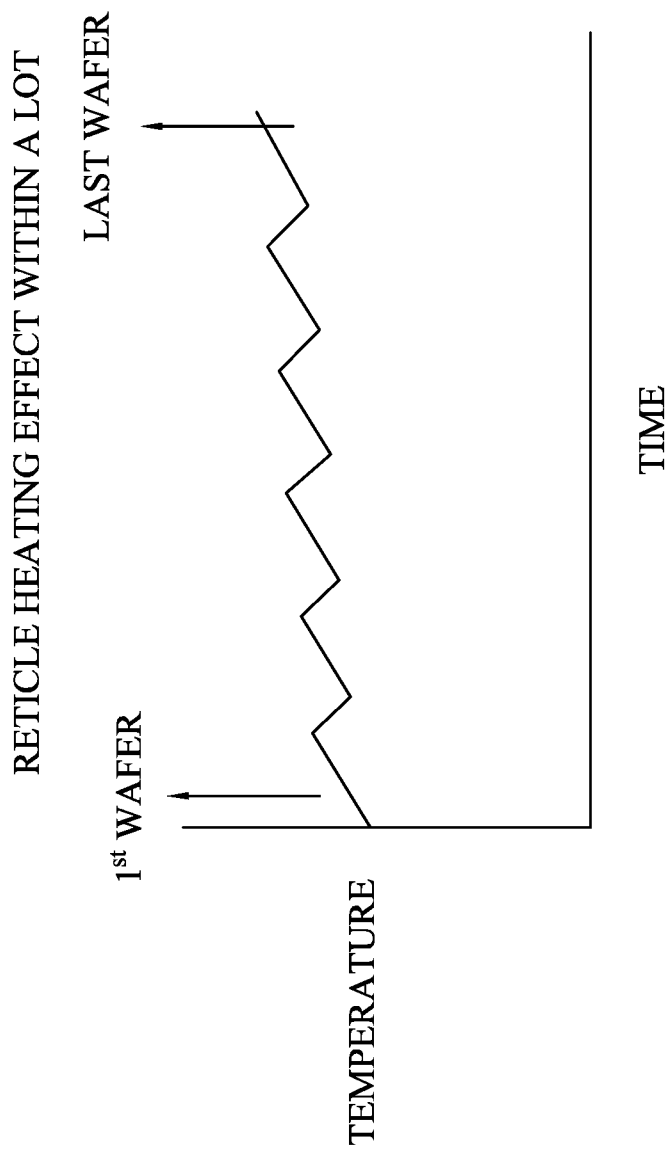
FIG. 6B is graph of the reticle heating effect within a lot of wafers from the first wafer to the last wafer over time with preheating in accordance with some embodiments.

FIG. 6A provides an illustrative graph of the reticle heating effect within a lot of wafers from the first wafer to the last wafer over time without preheating and maintaining of the reticle 102. As shown in FIG. 6A, the disparity of the temperature of the reticle 102 from the first wafer to the last wafer may result in significant changes to overlay performance, thus negatively impacting wafer uniformity and production. In contrast, FIG. 6B provides an illustrative graph of the reticle heating effect with a lot of wafers from the first wafer to the last waver over time utilizing the thermostatic reticle assembly 100, 200, or 300 in accordance with the embodiments disclosed herein. As shown in FIG. 6B, the uniform temperature of the reticle 102 during lot processing results in little to no variation in wafer production, resulting in substantial improvement in overlay performance. That is, by preheating the reticle 102 at the lot head (i.e., before the first wafer), the wafer-to-wafer temperature difference may be much smaller, thereby reducing the inter-wafer difference in overlay performance.

Figure 5:
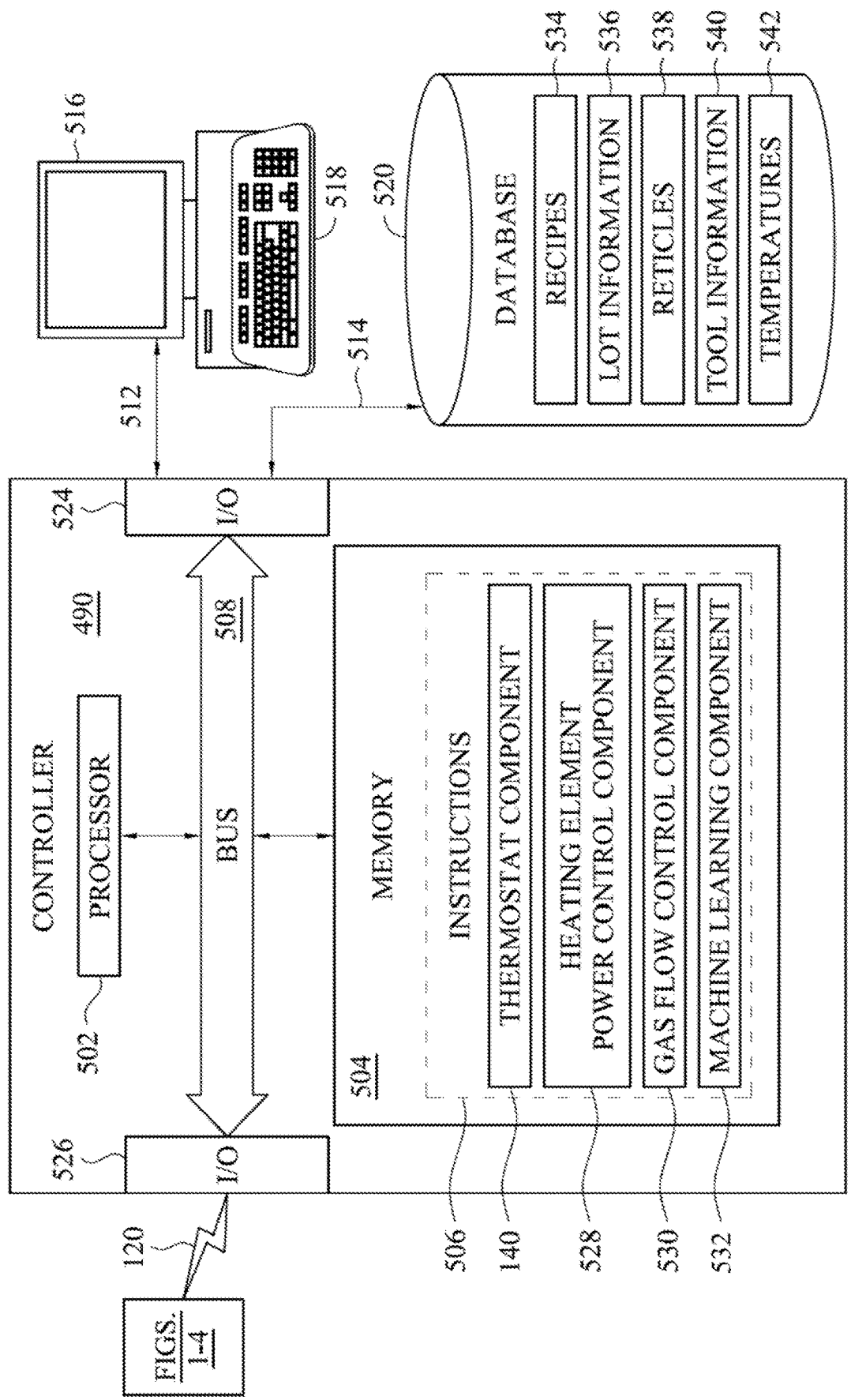
FIG. 5 illustrates a block diagram of a controller in accordance with some embodiments.

Turning now to FIG. 5, there is shown an illustrative block diagram of a suitable controller 490 associated with the EUV system 400 and the aforementioned thermostatic EUV reticle assemblies 100, 200, 300 in accordance with one embodiment of the subject application. The various components of the controller 490 may be connected by a data/control bus 508. The processor 502 of the controller 490 is in communication with an associated database 520 via a link 514. A suitable communications link 514 may include, for example, a switched telephone network, a wireless radio communications network, infrared, optical, or other suitable wired or wireless data communications. The database 520 is capable of implementation on components of the controller 490, e.g., stored in local memory 504, i.e., on hard drives, virtual drives, or the like, or on remote memory accessible to the controller 490.

The associated database 520 is representative of any organized collections of data (e.g., process tool information, fabrication information, material information, etc.) used for one or more purposes. The skilled artisan will appreciate that such information may be updated via machine learning during operations of the subject system 100. Implementation of the associated database 520 is capable of occurring on any mass storage device(s), for example, magnetic storage drives, a hard disk drive, optical storage devices, flash memory devices, or a suitable combination thereof. The associated database 520 may be implemented as a component of the controller 490, e.g., resident in memory 504, or the like. In one embodiment, the associated database 520 may include data corresponding to recipes 534, lot information 536, reticle information 538, tool information 540, temperature information 542, and the like. In other embodiments, the database 520 may further include, for example and without limitation, production scheduling, wafer positioning, process chamber information (e.g. type, position, status, etc.), and the like.

In accordance with one embodiment, the recipe information 534 stored in the database 520 may correspond to a particular processing protocols for the production of a wafer (e.g., materials to be used, photomasks/reticles to be used, EUV energy to be applied, and the like). In some embodiments, the recipe information 534 may correspond to parameter settings for a specific process in a specified process tool or metrology or inspection tool. The lot information 536 stored in the database 520 may correspond to information relating to a lot of wafers 460 to be processed. For example and without limitation, the lot information 536 may include the number of fields, scan speed, exposure dosage, recipe to be used, type of wafer 460, temperature restrictions/requirements, and the like. The database 520 may further include reticle information 538 corresponding to information about a particular reticle 102, e.g., steady-state temperature, thickness, material, corresponding recipe(s), etc. In some embodiments, the temperature information 542 stored in the database 520 may correspond to any temperature associated with operations of the EUV system 400, e.g., within the radiation source chamber 112, the process chamber 442, the reticle 102, the heating element(s) 108, 126, the gas 130, and the like. In another embodiment, the temperature information 542 may include a predetermined steady-state temperature of a reticle 102. According to one embodiment, the temperature information 542 may be continuously updated and revised in accordance with machine learning performed by the controller 490, as discussed below.

The controller 490 may include one or more input/output (I/O) interface devices 524 and 526 for communicating with external devices. The I/O interface 524 may communicate, via communications link 512, with one or more of a display device 516, for displaying information, such estimated destinations, and a user input device 518, such as a keyboard or touch or writable screen, for inputting text, and/or a cursor control device, such as mouse, trackball, or the like, for communicating user input information and command selections to the processor 502. The I/O interface 526 may communicate with external devices such as the radiation source chamber 412, the process chamber 442, the temperature sensors 114, the chiller component 116, the gas flow valve 128, the heating elements 108, 126, and the like, via a suitable the communications link 120.

It will be appreciated that the controller 490 illustrated in FIG. 5 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 5 as a networked set of components, the controller 490 is capable of implementation on a stand-alone device adapted to interact with the EUV system 400 and thermostatic EUV reticle assemblies 100, 200, 300 described herein.

The controller 490 may include one or more of a computer server, workstation, personal computer, cellular telephone, tablet computer, pager, combination thereof, or other computing device capable of executing instructions for performing the exemplary method.

According to one example embodiment, the controller 490 includes hardware, software, and/or any suitable combination thereof, configured to interact with an associated user, a networked device, networked storage, remote devices, or the like.

The memory 504 illustrated in FIG. 5 as a component of the controller 490 may represent any type of non-transitory computer readable medium such as random access memory (RAM), read only memory (ROM), magnetic disk or tape, optical disk, flash memory, or holographic memory. In one embodiment, the memory 504 comprises a combination of random access memory and read only memory. In some embodiments, the processor 502 and memory 504 may be combined in a single chip. The network interface(s) 524, 526 allow the computer to communicate with other devices via a computer network, and may comprise a modulator/demodulator (MODEM). Memory 504 may store data processed in the method as well as the instructions for performing the exemplary method.

The digital processor 502 can be variously embodied, such as by a single core processor, a dual core processor (or more generally by a multiple core processor), a digital processor and cooperating math coprocessor, a digital controller, or the like. The digital processor 502, in addition to controlling the operation of the controller 108, executes instructions 506 stored in memory 504 for performing the method set forth hereinafter.

As shown in FIG. 5, the instructions 506 stored in memory 504 may include a thermostat component 140 configured to receive temperature readings from the temperature sensors 114, direct heating of the heating elements 108, 126 and/or the chiller component 116 in accordance with the sensed temperature. In some embodiments, the thermostat component 140 may be a separate device in communication with the controller 490, rather than an internal component thereof. According to one embodiment, the thermostat component 140 may be programmable via the controller 490 in accordance with a particular recipe 534, lot information 536, reticle information 538, and the like. In operation, the thermostat component 140, alone or in conjunction with other components of the controller 490 may be configured to monitor temperature of the reticle 102 at a predetermined frequency, e.g., every 5 seconds, every 7 seconds, every 10 seconds, every 15 seconds, etc. It will be appreciated that the number of times the thermostat component 140 receives temperature readings from the sensors 114 may be determined in accordance with the scan speed of the EUV system 400. In such an implementation, the thermostat component 140 may be configured to receive temperature data from the sensors 114 in between exposures of the EUV system 400, allowing for heating or cooling of the reticle 102.

In some embodiments, the thermostat component 140 may be configured to monitor a temperature at a particular location on the reticle 102 and at a particular time associated therewith to accurately adapt/control the temperature of the reticle 102 in accordance with EUV operations. Further, the thermostat component 140 may be configured to control the heating element 108 to heat within a range of 20 to 80 degrees Celsius so as to raise the temperature of the reticle 102 to a predetermined steady-state temperature when the EUV system 400 is equipped with the thermostatic EUV assembly 100 of FIG. 1. In embodiments wherein the EUV system 400 employs the thermostatic assembly 200 or 300 of FIGS. 2-3, the thermostat component 140 may be configured to control the heating elements 126 to heat the gas 130 flowing into the passageways 124 between the burls 110 of the assembly 200 of FIG. 2, or the gas 130 flowing onto the reticle 102 of the assembly 300 of FIG. 3. The thermostat component 140 may work in conjunction with the valve 128 to regulate the flow of heated gas 130 during operations of the EUV system 400.

According to one embodiment, the thermostat component 140 is configured to receive a temperature of the reticle 102 prior to EUV operations. Based upon the received temperature, the thermostat component 140 may then activate the heating element 108 to raise the temperature of the reticle to its predetermined steady-state temperature. Similarly, when employing the assemblies 200, 300, the thermostat component 140 may be configured to activate the heating elements 126 and communicate, via the gas control component 530 to interact with the valve 128 to enable heated gas 130 to flow and raise the temperature of the reticle 102 to its predetermined steady-state temperature. In some embodiments, the thermostat component 140, in conjunction with the temperature sensors 114, may be configured to identify particular locations on the reticle 102 that require preheating/heating and direct the heating element 108 or flow of heated gas 130 to those identified locations. In other embodiments, the thermostat component 140 may be operable to receive temperature readings from the temperature sensors 114 during EUV operations and in response thereto, activate the chiller component 116 to reduce the temperature to the predetermined steady-state temperature.

As illustrated in FIG. 5, the instructions 506 stored in memory 504 may also include a heating element power control component 528 configured to supply power to the heating elements 108, 126 in conjunction with the thermostat component 140. The power control component 528, although illustrated as a component of the controller 490, may also be implemented as a standalone power supply, operative via the communications link 120 in response to a determination by the thermostat component 140 to activate the heating element 108 or 126. Further, the power control component 528 may include a power supply (not shown) or be in communication with a power supply and serve to regulate the power supplied by the power supply to the heating elements 108, 126, thereby varying the degree to which the reticle 102 is heated, the speed at which it is heated, and the like.

The instructions 506 stored in memory 504 may further include a gas flow control component 530 configured to activate and control a flow of gas 130 through the valve 128 to preheat/heat the reticle 102 of the thermostatic EUV reticle assembly 200 or 300. In some embodiments, the gas flow control component 530 may be configured to control a servo motor or other actuator (not shown) associated with the valve 128. In other embodiments, the gas flow control component 530 may be configured to adjust a throttle valve 132 associated with the valve 128, whereby heated gas 130 may be passed or blocked from entering the passageways 124 of the assembly 200. As indicated above, the gas flow control component 530 may be in communication with the thermostat component 140 and operate in conjunction therewith.

The memory 504 of the controller 490 may further store a machine learning component 532 in the instructions 506 configured to predict the steady-state temperature of a particular reticle 102 during EUV exposure. According to some embodiments, the machine learning component 532 may be implemented as an artificial neural network (ANN) that may be trained to determine an appropriate steady-state temperature of a reticle 102. In some embodiments, the machine learning component 532 may collect, for each round of exposure, system 400/reticle 102/thermostat 140 status and the spatial/temporal temperature distribution (from the sensors 114) for training of the machine learning kernel/component 532. The machine learning component 532, via this collection of information, will learn a steady-state temperature of the particular reticle 102 employing the recipe 534 and be capable of predicting and applying the learned steady-state temperature for subsequent EUV operations of the system 400 using the same reticle 102 and recipe 534. In such an embodiment, the machine learning component 532 may update the database 520 with the learned information and/or communicate a predetermined steady-state temperature to the thermostat component 140, which then functions as set forth above to preheat and/or maintain the temperature of the reticle 102 during EUV operations. The various components and hardware described above with respect to FIGS. 1-5 may be configured to perform and implement the methods set forth in greater detail below, e.g., the methods illustrated in the flowcharts of FIGS. 7-9.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

Turning now to FIG. 7, there is shown a functional diagram 700 depicting training and interactions of the machine learning component 532 in accordance with one embodiment of the subject application. As shown in FIG. 7, the machine learning component 532 is configured to receive, analyze, and communicate data in training and operations of the EUV system. The temperature of the reticle 102 is measured via the temperature sensors 114 located proximate to the reticle 102 at block 702. This information is communicated to the machine learning component 532. At block 704, the temperature of the reticle 102 is measured via sensors 114, which temperature is communicated to the machine learning component 532. The machine learning component 532 then retrieves EUV system information, recipe and temperature distributions from previous exposures at block 706. The machine learning component 532 (in conjunction with the thermostat component 140) then directs the dynamic hearing of the reticle 102 during EUV operations. The spatial and temporal temperature distribution of the reticle 102 during the current exposure is then recorded at block 710 and communicated to the machine learning component 532. Thereafter, the machine learning component 532 updates the information in block 706 using the recorded information from the current exposure. In this manner, the machine learning component 532 is configured to monitor operations of the EUV system 400, particularly reticle heating, and continuously adjust temperature distribution to ensure that the reticle 102 is properly preheated before EUV exposure and maintains a steady-state temperature throughout processing of a given lot of wafers.

Figure 8:
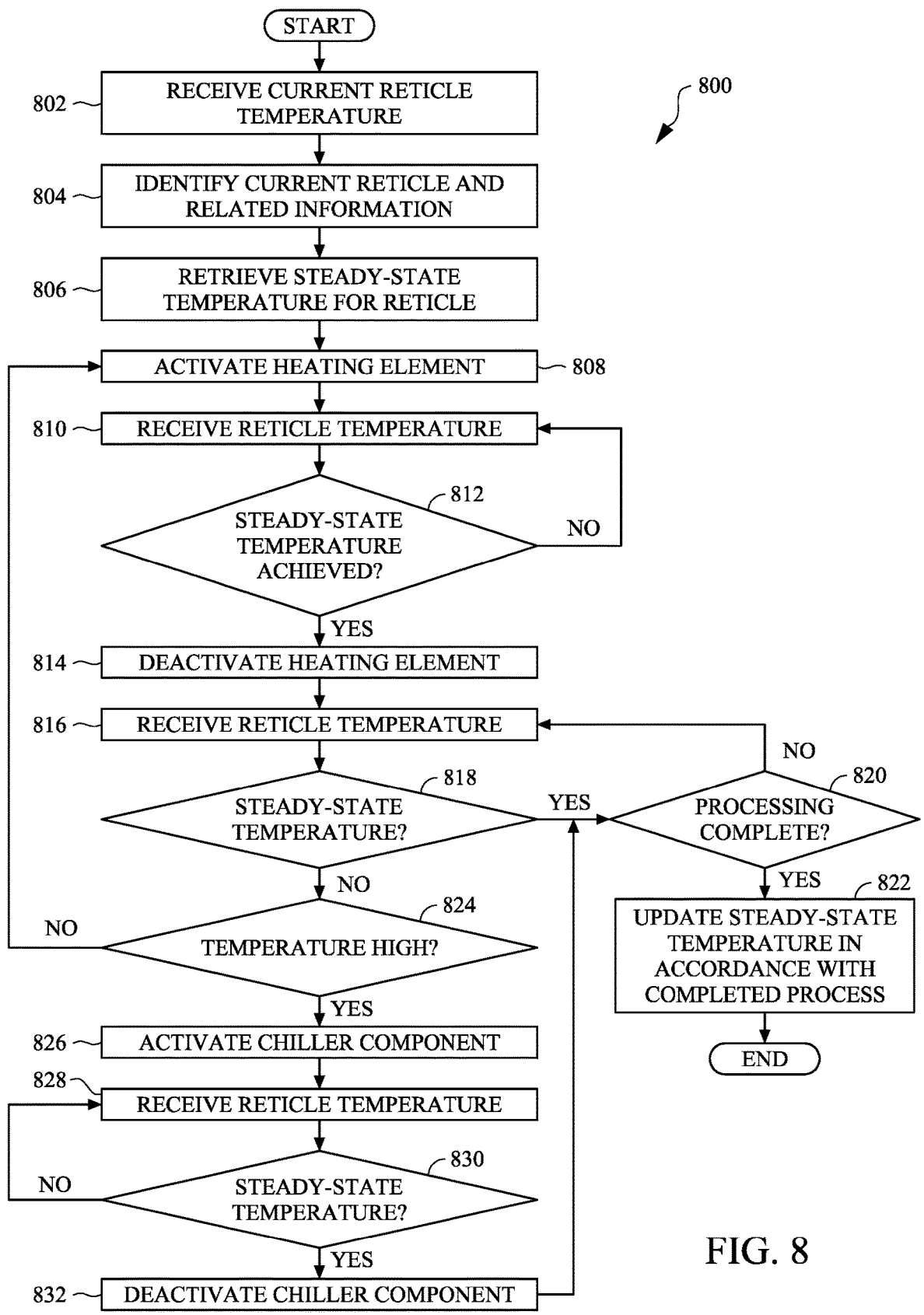
FIG. 8 is a flowchart illustrating a method for dynamically controlling reticle temperature in accordance with some embodiments.

Referring now to FIG. 8, there is shown a flowchart 800 illustrating a method for dynamically controlling reticle temperature in accordance with some embodiments. The flowchart 800 of FIG. 8 corresponds to the EUV system 400 utilizing the thermostatic EUV reticle assembly 100 of FIG. 1. The method begins at 802, whereupon the thermostat component 140 receives, from the one or more temperature sensors 114, the current spatial and temporal temperature of the reticle 102. At 804, the machine learning component 532 identifies the reticle 102, information about the EUV system 400 (e.g., tool status, internal temperature, exposure level, etc.), along with the recipe 534 and temperature distribution from previous exposures of the type of reticle 102. In some embodiments, this information may be retrieved by the machine learning component 532 from the associated database 520, or alternatively input via the user input device 518 or communicated to the machine learning component 532 from an external source (e.g., a networked server, workstation, or the like).

At 806, the machine learning component 532 retrieves the steady-state temperature of the reticle 102 from the associated database 520 in accordance with the identification of 804 and communicates the same to the thermostat component 140. In accordance with some embodiments, the thermostat component 140 may be programmed via the machine learning component 532 to heat and/or cool the reticle 102 to the retrieved steady-state temperature. In other embodiments, the machine learning component 532 may actively adjust the thermostat component 140 during operations of the EUV system 400 in accordance with the retrieved steady-state temperature.

At 808, the thermostat component 140, responsive to the current temperature of the reticle 102 activates the heating element 108 to preheat the reticle 102 to the retrieved steady-state temperature. As discussed above, the ambient temperature of the process chamber 442 during installation of the reticle 102 is typically in the range of 18 to 20 degrees Celsius. The steady-state temperature of the reticle 102 may be in the range of 45 to 55 degrees Celsius. As such, the thermostat component 140 may be configured to control the heating element 108 to heat within a range of 20 to 80 degrees Celsius so as to raise the temperature of the reticle 102 to the predetermined steady-state temperature. At 810, the temperature of the reticle 102 is received from the temperature sensors 114 at the thermostat component 140. A determination is then made at 812 whether the reticle 102 been preheated to the retrieved steady-state temperature. Upon a negative determination at 812, operations return to 810, whereupon the temperature of the reticle 102 is received. In some embodiments, this process of heating and checking the temperature of the reticle 102 may be performed during a predefined interval, e.g., every 2 seconds, every 5 seconds, every 10 seconds, or the like.

Upon a positive determination at 812 that the reticle 102 has been preheated to the retrieved steady-state temperature, operations proceed to 814, whereupon the thermostat component 140 deactivates the heating element 108. The EUV system 400 may then proceed to begin EUV operations on a wafer 460. The temperature of the reticle 102 is then received from the temperature sensors 114 by the thermostat 140 at 816. A determination is then made at 818 whether the reticle 102 remains at the steady-state temperature. Upon a positive determination at 818, operations proceed to 820, whereupon a determination is made whether wafer processing has been completed by the EUV system 400. Upon a positive determination at 820, operations proceed to 822, whereupon the machine learning component 532 updates the steady-state temperature stored in the database 520 with the spatial and temporal distribution of temperatures of the reticle 102 during EUV operations. That is, the machine learning component 532 adjusts the steady-state temperature for the particular reticle 102 in accordance with the measurements and other information collected during the preceding EUV operations, thereby dynamically updating the steady-state temperature for the reticle 102. Operations with respect to FIG. 8 terminate thereafter.

Figures 10A, 10B:
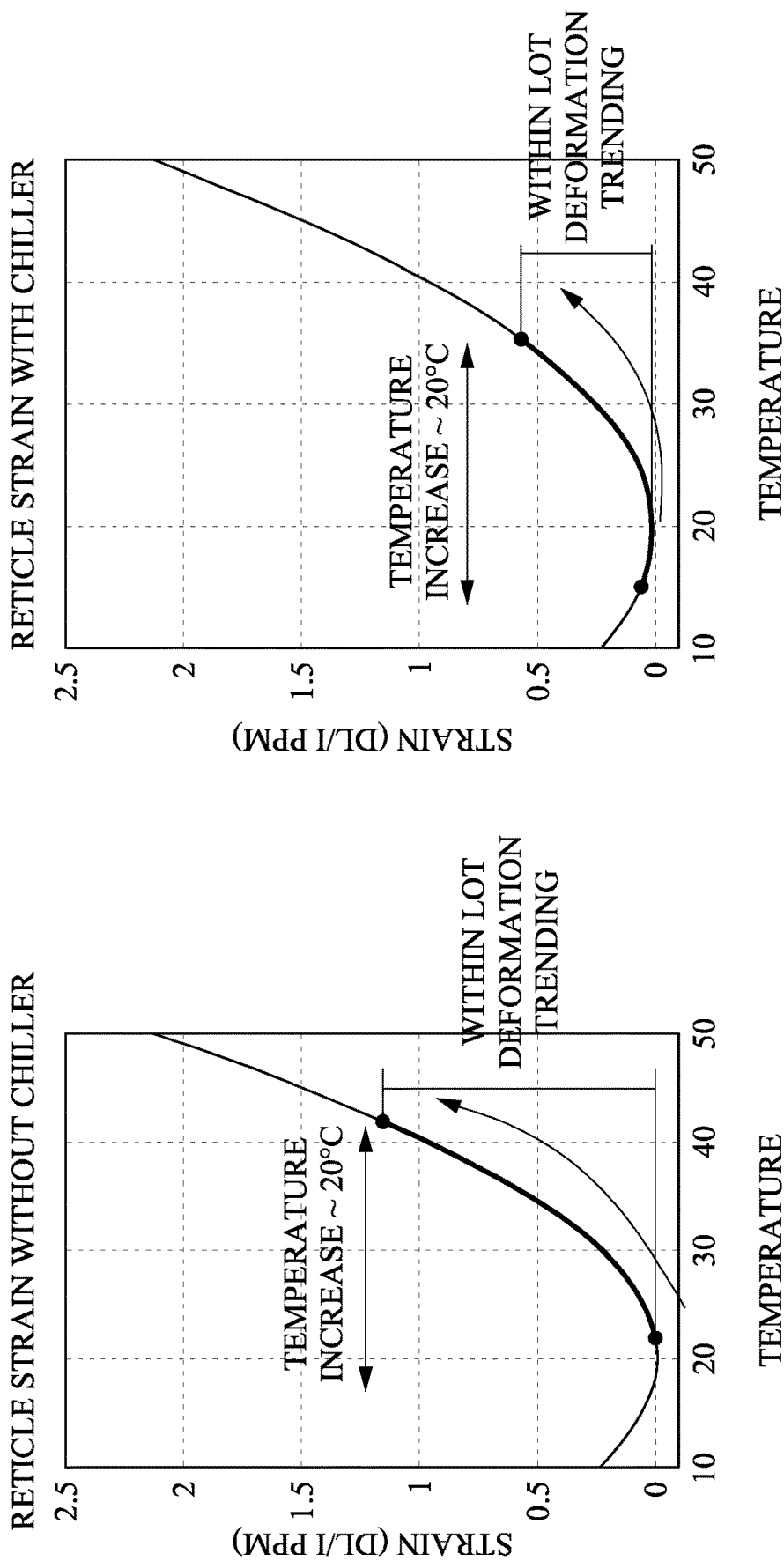
FIG. 10A is a graphical illustration of wafer throughput without cooling in accordance with some embodiments.
FIG. 10B is a graphical illustration of wafer throughput with cooling in accordance with some embodiments.

Returning to 818, upon a determination that the reticle 102 is not at the steady-state temperature, operations progress to 824, whereupon a determination is made whether the temperature of the reticle 102 is too high, i.e., above the steady-state temperature. A negative determination at 824 prompts a return to 808, whereupon the heating element 108 is activated to raise the temperature of the reticle 102 to the steady-state temperature. When it is determined at 824 that the temperature of the reticle 102 is above the steady-state temperature, operations proceed to 826, whereupon the chiller component 116 is activated via the thermostat component 140. In some embodiments, activation of the chiller component 116 includes activation of an associated pump (not shown) to move coolant 118 through the chiller component 116 so as to reduce the temperature of the reticle 102. FIG. 10A is a graphical illustration of wafer throughput without cooling in accordance with some embodiments. As shown in FIG. 10A, thermal expansion of the reticle 102 may negatively impact wafer production. In contrast, FIG. 10B is a graphical illustration of wafer throughput with cooling in accordance with some embodiments. Accordingly, use of the chiller component 116 to reduce the temperature of the reticle 102 to the steady-state temperature increases wafer production by reducing the lot deformation.

At 828, the temperature of the reticle 102 is again received from the temperature sensors 114 by the thermostat component 140. A determination is then made at 830 whether the reticle 102 has reached the steady-state temperature. Upon a negative determination at 830, operations return to monitoring the temperature of the reticle 102 at 828 as the chiller component 116 is operating. Upon a positive determination at 830 that steady-state temperature has been achieved, operations proceed to 832, whereupon the chiller component 116 is deactivated. Operations then progress to 820, whereupon a determination is made whether EUV processing has been completed. As indicated above, a negative determination at 820 (i.e., EUV wafer processing is still being performed) returns operations to 816, and a positive determination at 820 progresses to 822 for an update by the machine learning component 532 to the steady-state temperature stored in the database 520 responsive to the temporal and spatial temperature measurements received from the temperature sensors 114 during the immediately preceding wafer processing operations.

Figure 9:
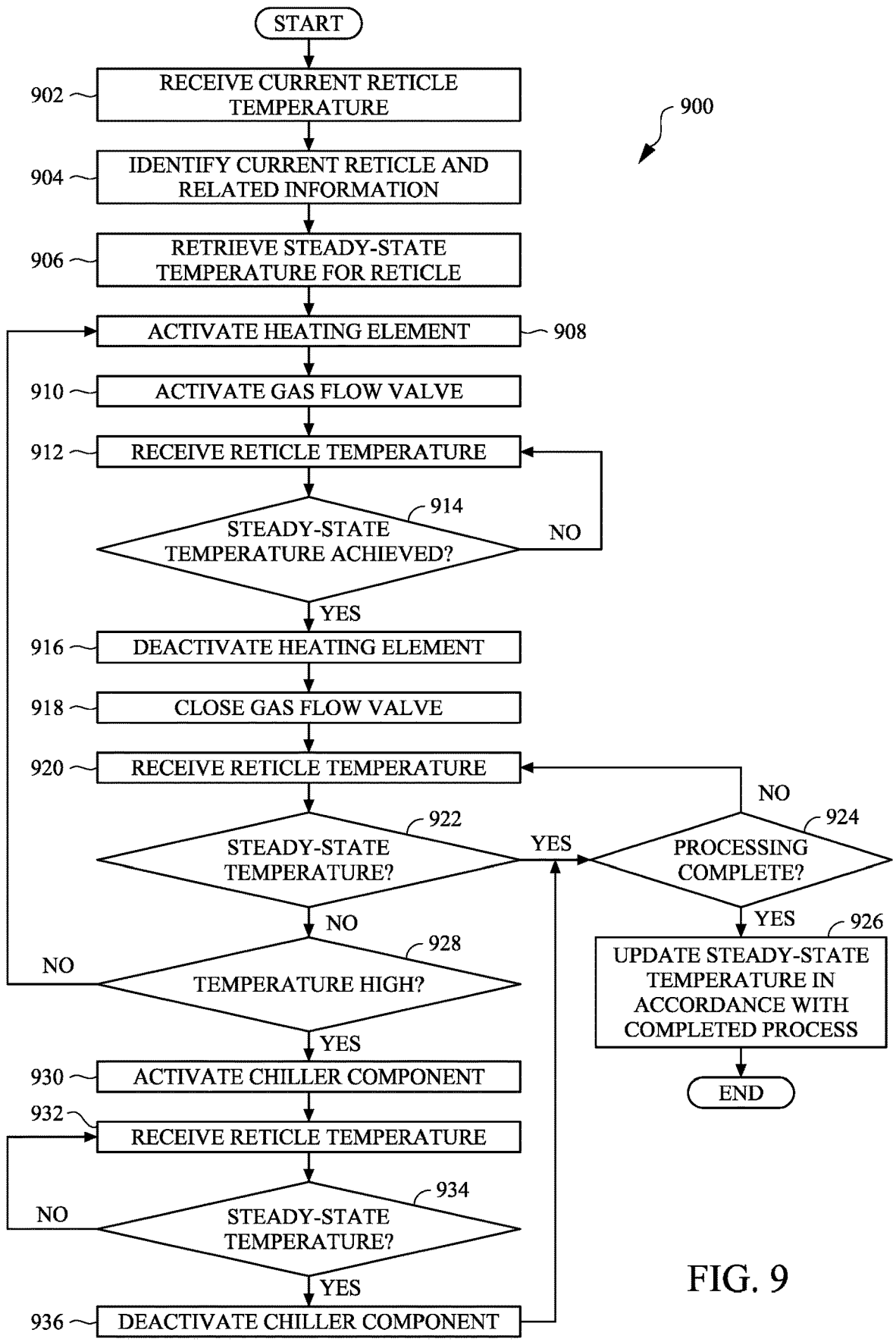
FIG. 9 is a flowchart illustrating a method for dynamically controlling reticle temperature in accordance with some embodiments.

Turning now to FIG. 9, there is shown another embodiment of the method for dynamically controlling reticle temperature. The flowchart 900 of FIG. 9 corresponds to the EUV system 400 utilizing the thermostatic EUV reticle assembly 200 of FIG. 2 or the thermostatic EUV reticle assembly 300 of FIG. 3. The method begins at 902, whereupon the thermostat component 140 receives, from the one or more temperature sensors 114, the current spatial and temporal temperature of the reticle 102. At 904, the machine learning component 532 identifies the reticle 102, information about the EUV system 400 (e.g., tool status, internal temperature, exposure level, etc.), along with the recipe 534 and temperature distribution from previous exposures of the type of reticle 102. In some embodiments, this information may be retrieved by the machine learning component 532 from the associated database 520, input via the user input device 518 or communicated to the machine learning component 532 from an external source (e.g., a networked server, workstation, or the like).

At 906, the machine learning component 532 retrieves the steady-state temperature corresponding to the identified reticle 102 from the associated database 520 and communicates the same to the thermostat component 140. In accordance with some embodiments, the thermostat component 140 may be programmed via the machine learning component 532 to heat and/or cool the reticle 102 to the retrieved steady-state temperature. In other embodiments, the machine learning component 532 may actively adjust the thermostat component 140 during operations of the EUV system 400 in accordance with the retrieved steady-state temperature.

At 908, the thermostat component 140, responsive to the current temperature of the reticle 102 activates the heating elements 126 to heat the gas 130 for preheating of the reticle 102 in accordance with the retrieved steady-state temperature. At 910, the thermostat component 140 directs the gas valve 128 to open, allowing gas 130 to flow through the supply 122 (and heating elements 126) into the passageways 124 through the gaps 112 to preheat the reticle 102. In an embodiment utilizing the assembly 300 of FIG. 3, it will be appreciated that the heated gas 130 will transit the valve 128 to directly contact the reticle 102, as illustrated in FIG. 3. At 912, the temperature of the reticle 102 is received from the temperature sensors 114 at the thermostat component 140. A determination is then made at 914 whether the reticle 102 been preheated to the retrieved steady-state temperature. Upon a negative determination at 914, operations return to 912, whereupon the temperature of the reticle 102 is received. In some embodiments, this process of heating and checking the temperature of the reticle 102 may be performed during a predefined interval, e.g., every 2 seconds, every 5 seconds, every 10 seconds, or the like.

Upon a positive determination at 914 that the reticle 102 has been preheated to the retrieved steady-state temperature, operations proceed to 916, whereupon the thermostat component 140 deactivates the heating element 108. The gas flow valve 128 is then closed at 918 in response to the arrival at the aforementioned steady-state temperature. The EUV system 400 may then proceed to begin EUV operations on a wafer 460. The temperature of the reticle 102 is then received from the temperature sensors 114 by the thermostat 140 at 920. A determination is then made at 922 whether the reticle 102 remains at the steady-state temperature. Upon a positive determination at 922, operations proceed to 924, whereupon a determination is made whether wafer processing has been completed by the EUV system 400. Upon a positive determination at 924, operations proceed to 926, whereupon the machine learning component 532 updates the steady-state temperature stored in the database 520 with the spatial and temporal distribution of temperatures of the reticle 102 during EUV operations. That is, the machine learning component 532 adjusts the steady-state temperature for the particular reticle 102 in accordance with the measurements and other information collected during the preceding EUV operations, thereby dynamically updating the steady-state temperature for the reticle 102. Operations with respect to FIG. 9 terminate thereafter.

Returning to 922, upon a determination that the reticle 102 is not at the steady-state temperature, operations progress to 928, whereupon a determination is made whether the temperature of the reticle 102 is too high, i.e., above the steady-state temperature. A negative determination at 928 prompts a return to 908, whereupon the heating elements 126 are activated and operations proceed thereon to open the gas valve 130 so as to raise the temperature of the reticle 102 to the steady-state temperature. When it is determined at 928 that the temperature of the reticle 102 is above the steady-state temperature, operations proceed to 930, whereupon the chiller component 116 is activated via the thermostat component 140. In some embodiments, activation of the chiller component 116 includes activation of an associated pump (not shown) to move coolant 118 through the chiller component 116 so as to reduce the temperature of the reticle 102.

At 932, the temperature of the reticle 102 is again received from the temperature sensors 114 by the thermostat component 140. A determination is then made at 934 whether the reticle 102 has reached the steady-state temperature. Upon a negative determination at 934, operations return to monitoring the temperature of the reticle 102 at 932 as the chiller component 116 is operating. Upon a positive determination at 934 that steady-state temperature has been achieved, operations proceed to 936, whereupon the chiller component 116 is deactivated. Operations then progress to 924, whereupon a determination is made whether EUV processing has been completed. As indicated above, a negative determination at 924 (i.e., EUV wafer processing is still being performed) returns operations to 920, and a positive determination at 924 progresses to 926 for an update by the machine learning component 532 to the steady-state temperature stored in the database 520 responsive to the temporal and spatial temperature measurements received from the temperature sensors 114 during the immediately preceding wafer processing operations.

In accordance with a first embodiment, there is provided a method for dynamically controlling reticle temperature of a thermostatic reticle assembly. The method includes the step of receiving, from at least one sensor, a current temperature of a reticle via a thermostat component. The method also includes the step of retrieving, from an associated database, a steady-state temperature associated with the reticle. In addition, the method includes the step of preheating the reticle via a heating element by the thermostat component in accordance with the retrieved steady-state temperature.

In accordance with a second embodiment, there is provided a system for dynamically controlling a temperature of a thermostatic reticle. The system includes a thermostatic reticle assembly that comprises a reticle, one or more temperature sensors located in proximity to the reticle, and one or more heating elements. The system also includes a thermostat component that is in communication with the one or more temperature sensors and the one or more heating elements. The system further includes a controller that includes a processor in communication with memory. The memory stores instructions which are executed by the processor to receive, from the at least one temperature sensor by the thermostat component, a current temperature of the reticle, and retrieve, from an associated database, a steady-state temperature corresponding to the reticle. The instructions further include activating, via the thermostat component, the at least one heating element in response to preheat the reticle to the retrieved steady-state temperature in accordance with the current temperature of the reticle.

In accordance with a third embodiment, there is provided a computer-implemented method for dynamically controlling reticle temperature of a thermostatic reticle assembly. The method includes the step of receiving, from at least one sensor, a current temperature of a reticle via a thermostat component. The method further includes identifying, via a machine learning component, the reticle of the thermostatic reticle assembly and a recipe using the reticle in EUV lithography. Additionally, the method includes retrieving, from an associated database, a steady-state temperature associated with the identified reticle and recipe, and activating the at least one heating element in proximity to the reticle. The method also includes receiving, from the at least one sensor, a temperature of the reticle subsequent to activating the at least one heating element, and deactivating the at least one heating element responsive to the temperature of the reticle reaching the steady-state temperature. Furthermore, the method includes receiving, from the at least one sensor, a temperature of the reticle after deactivating the at least one heating element. In addition, the method includes comparing the temperature of the reticle after deactivating the at least one heating element to the steady-state temperature, and activating a chiller component in response to a result of the comparison.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for dynamically controlling reticle temperature of a thermostatic reticle assembly, comprising:
    receiving, from at least one sensor, a current temperature of a reticle of the thermostatic reticle assembly via a thermostat component, wherein the thermostatic reticle assembly comprises at least one heating element;
    retrieving, from an associated database, a steady-state temperature associated with the reticle; and
    preheating the reticle of the thermostatic reticle assembly via a heating element by the thermostat component in accordance with the retrieved steady-state temperature, wherein preheating the reticle further comprises:
        activating at least one heating element in proximity to the reticle,
        activating a gas flow valve positioned within a gas supply line subsequent to activating the at least one heating element, wherein the at least one heating element positioned adjacent to the gas supply line to heat a gas transiting therethrough,
        receiving, from at least one sensor, a temperature of the reticle subsequent to activating the at least one heating element,
        deactivating the at least one heating element responsive to the temperature of the reticle reaching the steady-state temperature, and
        closing the gas flow valve subsequent to deactivating the at least one heating element.

2. The method of claim 1, wherein retrieving the steady-state temperature further comprises:
    identifying at least one of the reticle of the thermostatic reticle assembly and a recipe, and
    retrieving the steady-state temperature in accordance with the at least one identified reticle and recipe.

3. The method of claim 1, wherein the at least one heating element is an inductive heating element positioned adjacent to the reticle.

4. The method of claim 1, wherein the thermostatic reticle assembly includes at least one passageway in fluidic communication with the reticle, wherein the at least one passageway is coupled to the gas supply line allowing the heated gas to transit therethrough.

5. The method of claim 1, wherein the thermostat component is configured to monitor the temperature of the reticle in accordance with a predetermined frequency.

6. The method of claim 5, wherein the thermostat component is configured to activate or deactivate the at least one heating element in accordance with the temperature relative to the steady-state temperature.

7. The method of claim 1, wherein the thermostatic reticle assembly is an extreme ultraviolet lithography (EUV) reticle assembly.

8. A system for dynamically controlling a temperature of a thermostatic reticle, comprising:
    a thermostatic reticle assembly, comprising:
        a reticle,
        at least one temperature sensor in proximity to the reticle, and
        at least one heating element;
    a thermostat component in communication with the at least one temperature sensor and the at least one heating element; and
    a controller comprising a processor in communication with memory storing instructions which are executed by the processor to:
        receive, from the at least one temperature sensor by the thermostat component, a current temperature of the reticle,
        retrieve, from an associated database, a steady-state temperature corresponding to the reticle, and
        activate, via the thermostat component, the at least one heating element in response to preheat the reticle to the retrieved steady-state temperature in accordance with the current temperature of the reticle,
        activate a gas flow valve positioned within a gas supply line subsequent to activating the at least one heating element, wherein the at least one heating element positioned adjacent to the gas supply line to heat a gas transiting therethrough, and
        closing the gas flow valve subsequent to deactivating the at least one heating element.

9. The system of claim 8, wherein the at least one heating element is positioned in contact with the reticle.

10. The system of claim 9, wherein the at least one heating element is an inductive heating element.

11. The system of claim 8, wherein the thermostat component is configured to monitor the temperature of the reticle in accordance with a predetermined frequency.

12. The system of claim 11, wherein the predetermined frequency is in the range of every 5 to 10 seconds.

13. The system of claim 12, wherein the thermostat component is configured to deactivate the at least one heating element responsive to the temperature of the reticle reaching the steady-state temperature.

14. The system of claim 8, wherein the thermostatic reticle assembly includes at least one passageway in fluidic communication with the reticle, wherein the at least one passageway is coupled to the gas supply line allowing the heated gas to transit therethrough.

15. The system of claim 8, wherein the memory further stores a machine learning component configured operable to:
 receive temperature information from the at least one temperature sensor corresponding to exposures of the reticle;
 retrieve recipe and temperature distribution associated with the reticle from the associated database; and
 update the steady-state temperature associated with the reticle for subsequent processing.

16. The system of claim 15, wherein the machine learning component is further configured to record spatial and temporal temperature distribution of the reticle during a current exposure, and wherein the steady-state temperature associated with the reticle is updated in accordance therewith.

17. A computer-implemented method for dynamically controlling reticle temperature of a thermostatic reticle assembly, comprising:
 receiving, from at least one sensor, a current temperature of a reticle via a thermostat component;
 identifying, via a machine learning component, the reticle of the thermostatic reticle assembly and a recipe using the reticle in EUV lithography;
 retrieving, from an associated database, a steady-state temperature associated with the identified reticle and recipe;
 activating at least one heating element in proximity to the reticle;
 activating a gas flow valve positioned within a gas supply line subsequent to activating the at least one heating element, wherein the at least one heating element is positioned adjacent to the gas supply line to heat a gas transiting therethrough;
 receiving, from the at least one sensor, a temperature of the reticle subsequent to activating the at least one heating element;
 deactivating the at least one heating element responsive to the temperature of the reticle reaching the steady-state temperature;
 closing the gas flow valve subsequent to deactivating the at least one heating element;
 receiving, from the at least one sensor, a temperature of the reticle after deactivating the at least one heating element;
 comparing the temperature of the reticle after deactivating the at least one heating element to the steady-state temperature; and
 activating a chiller component in response to a result of the comparison.

18. The computer-implemented method of claim 17, wherein the thermostatic reticle assembly includes at least one passageway in fluidic communication with the reticle, wherein the at least one passageway is coupled to the gas supply line allowing the heated gas to transit therethrough.

19. The computer-implemented method of claim 17, further comprising:
 receiving temperature information from the at least one temperature sensor corresponding to exposures of the reticle;
 retrieving recipe and temperature distribution associated with the reticle from the associated database; and
 updating the steady-state temperature associated with the reticle for subsequent processing.

20. The computer-implemented method of claim 19, further comprising recording spatial and temporal temperature distribution of the reticle during a current exposure, and
 updating the steady-state temperature associated with the reticle in accordance with the recorded spatial and temporal distribution.

* * * * *